United States Patent
Chattopadhyay et al.

(10) Patent No.: US 10,608,645 B2
(45) Date of Patent: Mar. 31, 2020

(54) FAST LOCKING CLOCK AND DATA RECOVERY CIRCUIT

(71) Applicant: Synopsys, Inc., Mountain View, CA (US)

(72) Inventors: Biman Chattopadhyay, Karnataka (IN); Ravi Mehta, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 150 days.

(21) Appl. No.: 15/862,857

(22) Filed: Jan. 5, 2018

(65) Prior Publication Data
US 2019/0097639 A1    Mar. 28, 2019

(30) Foreign Application Priority Data
Sep. 25, 2017   (IN) .............. 201741034035

(51) Int. Cl.
| | |
|---|---|
| G06F 1/12 | (2006.01) |
| H03L 7/08 | (2006.01) |
| H04L 7/00 | (2006.01) |
| H03L 7/091 | (2006.01) |
| H04L 7/033 | (2006.01) |
| H03L 7/099 | (2006.01) |
| H03L 7/087 | (2006.01) |

(52) U.S. Cl.
CPC ............ *H03L 7/0807* (2013.01); *H03L 7/087* (2013.01); *H03L 7/091* (2013.01); *H03L 7/099* (2013.01); *H04L 7/0025* (2013.01); *H04L 7/033* (2013.01); *H03L 2207/06* (2013.01)

(58) Field of Classification Search
CPC ...................................... H03L 7/0807
See application file for complete search history.

(56) References Cited

U.S. PATENT DOCUMENTS

| | | | | |
|---|---|---|---|---|
| 2008/0297216 | A1* | 12/2008 | Chiang | ............ G01R 31/3016 327/158 |
| 2014/0191787 | A1* | 7/2014 | Xing et al. | ............ H03L 7/0891 327/157 |
| 2014/0301515 | A1* | 10/2014 | Iravani | .................. H03L 7/0891 357/371 |
| 2015/0162922 | A1* | 6/2015 | Song et al. | ............... H03L 7/14 713/500 |
| 2018/0013434 | A1* | 1/2018 | Amirkhany | ........... H03L 7/0807 |

* cited by examiner

*Primary Examiner* — Mohammed H Rehman
(74) *Attorney, Agent, or Firm* — Fenwick & West LLP

(57) ABSTRACT

A clock and data recovery circuit includes a bang-bang phase detector (BBPD), a voltage controlled oscillator (VCO), a frequency control circuit, and an up-down counter. The BBPD generates an early-late signal by determining whether serialized data received by the BBPD is early or late with respect to a VCO clock signal generated by the VCO. A phase of the VCO clock signal is controlled based on the early-late signal. The frequency control circuit compares a frequency of the VCO clock signal and a target frequency and generates an up/down signal. Based on the up/down signal, the up-down counter increments or decrements the frequency of the VCO clock signal to match the target frequency.

20 Claims, 3 Drawing Sheets

FAST LOCKING CLOCK AND DATA RECOVERY CIRCUIT

CROSS-RELATED APPLICATIONS

This application claims priority of Indian Application Serial No. 201741034035, filed Sep. 25, 2017, the contents of which are incorporated herein by reference.

FIELD OF THE INVENTION

The present invention relates generally to electronic circuits, and more particularly, to a clock and data recovery (CDR) circuit.

BACKGROUND

A CDR circuit is commonly used in a high speed data communication system. Generally, the high speed data communication system receives data without an accompanying clock signal. An absence of the accompanying clock signal may result in undersampling or oversampling of the data. Thus, a CDR circuit is used in the high speed data communication system to generate a clock signal that is phase and frequency synchronized with the data. Further, the high speed data communication system samples the data at the frequency of the clock signal.

A Passive optical network (PON) is an example of the high speed data communication system that employs CDR circuits for generating the clock signal that is frequency and phase synchronized with the data. The PON typically includes an optical line terminal (OLT) for communicating with multiple optical network units (ONUs). In downstream data transmission, the OLT is connected to a splitter by way of a fiber optic cable. The splitter receives downstream data from the OLT, splits the downstream data into a plurality of data streams, and transmits the plurality of data streams simultaneously to the multiple ONUs. In upstream data transmission, each ONU transmits corresponding upstream data in burst mode to a combiner one at a time. The combiner receives the corresponding upstream data from each of the ONUs by way of the fiber optic cable and transmits the corresponding upstream data to the OLT.

The OLT transmits downstream data to the multiple ONUs in continuous mode. Hence, CDR circuits in the multiple ONUs have sufficient time to get frequency and phase synchronized to the downstream data. However, upstream data transmitted by the multiple ONUs to the OLT are transmitted in burst mode. Burst mode is a temporary high-speed data transmission mode used for facilitating sequential data transfer at a high throughput. Burst mode data transfer speed is typically two to five times faster than continuous mode data transfer speed. Since a large amount of upstream data is sent by the multiple ONUs in a short period of time, a CDR circuit on the OLT must be frequency and phase synchronized to the upstream data. If the phase of the clock signal is not synchronized to the upstream data, the clock signal may oversample the upstream data, and the periodicity of the clock signal may vary over multiple clock cycles. Variations in the periodicity of the clock cycle may lead to jitter in the upstream data. Jitter in the upstream data is undesirable as it may lead to data loss. Further, the clock signal may be staggered with respect to the data. Hence, the clock signal must be frequency and phase synchronized to the upstream data in a short time to avoid staggering of the clock signal and jitter in the upstream data.

CDR circuits are further employed in a low latency interface (LLI) system for performing clock and data recovery. The LLI system provides a point-to-point interconnect between two components on devices such as a mobile phone, a central processing unit, and the like. In one example, the two components are a processor and a memory. The processor may be a processor such as a baseband processor, a graphics controller, a digital signal processor, and the like. The memory may be a memory such as a random access memory, a flash memory, and the like. The processor transmits and receives the data in burst mode by way of a direct mode access (DMA) controller. Typically, a common clock is provided in the device for the processor and the DMA controller. Since a common clock is provided for the processor and the DMA controller, the processor and the DMA controller are frequency synchronized. However, the data received or transmitted by the processor from the memory or to the memory may have a phase difference with a phase of the common clock. Hence, the CDR circuit with fast phase synchronization is imperative to avoid data loss caused due to staggering and jitter.

Conventional bang-bang (BB) (Alexander) CDR circuits are employed for frequency and phase locking in various digital systems. A known implementation of the BBCDR circuit includes a bang-bang phase detector (BBPD), proportional and integral control circuits, and a voltage controlled oscillator (VCO). The BBPD determines whether a clock signal generated by the VCO is early or late with respect to an input signal. If a rising edge of the clock signal arrives before a transition of the input signal from a first logic state to a second logic state, the clock signal is early with respect to the input signal. If the rising edge of the clock signal arrives after the transition of the input signal from the first logic state to the second logic state, the clock signal is late with respect to the input signal. The BBPD further generates an early-late signal based on whether the clock signal is early or late with respect to the input signal.

The BBPD is further connected to the proportional and integral control circuits. The proportional and integral control circuits receive the early-late signal and generate proportional and integral control signals, respectively, for controlling the VCO. The VCO further generates the clock signal based on the proportional and integral control signals. The proportional control signal controls the phase of the clock signal. The integral control signal controls the frequency of the clock signal. However, the integral control circuit introduces delays in generation of the integral control signal. The delay in a settling time of the integral control signal delays the phase locking of the clock signal to the data. This causes the clock signal to be staggered, and further introduces jitter in the data. Another implementation of the CDR circuit employs a phase-interpolator for generating the clock signal that is frequency and phase synchronized to the data. The phase interpolator is further controlled by way of the proportional and integral control signals. The integral control signal hinders fast locking of the clock signal to the data in both VCO-based and PI-based implementations.

To overcome the aforementioned problems, a gated VCO CDR circuit, an oversampling CDR circuit, and a blind CDR circuit may be used for achieving phase synchronization with the data in a short time. The gated VCO CDR circuit employs two VCOs for generating a clock signal that is frequency and phase synchronized to the data. However, employing two VCOs in the gated VCO CDR circuit increases its design complexity and further leads to high power consumption by the gated VCO CDR circuit. The oversampling CDR circuit employs a sampling clock signal at a high frequency for sampling the data and generating sampled data. Based on the sampled data, the oversampling CDR circuit generates the clock signal. In one example, the sampling clock signal is used to sample the data six times in one clock cycle. If the clock signal has a frequency of 10 MHz, then the sampling clock signal needs to have a frequency of 60 MHz. Hence, the oversampling CDR circuit introduces jitter in the data when employed for very high speed clock signals. The blind CDR circuit samples the data with an asynchronous clock signal to generate sampled data. The blind CDR circuit further uses a digital interpolator for recovering the data from the sampled data. The blind CDR circuit requires complex mixed signal and digital circuits such as an analog-to-digital converter, the digital interpolator and the like. The blind CDR circuit further consumes high power.

Hence, it would be advantageous to have a CDR circuit that performs fast phase locking, prevents jitter in the recovered data and prevents staggering of the recovered clock, and consumes less power.

SUMMARY

In one embodiment of the present invention, a clock and data recovery (CDR) circuit is provided. The CDR circuit includes a phase detector, a voltage controlled oscillator (VCO), a frequency control circuit, and a counter. The phase detector receives serialized data and a VCO clock signal. The phase detector determines that the VCO clock signal is at least one of early and late with respect to the serialized data, and generates an early-late signal. The VCO receives the early-late signal and a frequency control code, and generates the VCO clock signal. The VCO controls a phase of the VCO clock signal based on the early-late signal. The VCO controls a frequency of the VCO clock signal based on the frequency control code. The frequency control circuit receives the VCO clock signal and a reference clock signal, and generates an up/down signal. The counter receives the up/down signal and outputs the frequency control code. The counter performs at least one of incrementing and decrementing the frequency control code by a predefined value based on the up/down signal for matching the frequency of the VCO clock signal to a target frequency.

In another embodiment of the present invention, a clock and data recovery (CDR) circuit is provided. The CDR circuit includes a phase detector, a voltage controlled oscillator (VCO), a frequency control circuit, and a first counter. The phase detector receives serialized data and a VCO clock signal. The phase detector determines that the VCO clock signal is at least one of early and late with respect to the serialized data, and generates an early-late signal. The VCO receives the early-late signal and a frequency control code, and generates the VCO clock signal. The VCO controls a phase of the VCO clock signal based on the early-late signal. The VCO controls a frequency of the VCO clock signal based on the frequency control code. The frequency control circuit includes a second counter and a digital comparator. The second counter receives the VCO clock signal. The second counter counts a number of clock cycles of the VCO clock signal over a predetermined time period, and generates a clock count value. The digital comparator receives the clock count value and the reference clock signal. The digital comparator compares the clock count value with a target count value, and generates the up/down signal. The first counter receives the up/down signal and outputs the frequency control code. The first counter performs at least one of incrementing and decrementing the frequency control code by a predefined value based on the up/down signal for matching the frequency of the VCO clock signal to a target frequency.

In various embodiments of the present invention, a clock and data recovery (CDR) circuit is provided. A receiver of an optical line terminal (OLT) of a passive optical network includes the CDR circuit. The CDR circuit includes a bang-bang phase detector (BBPD), a voltage controlled oscillator (VCO), a frequency control circuit, and an up-down counter. The OLT includes a buffer that receives receiver data. The buffer performs signal conditioning of the receiver data and outputs amplified receiver data, i.e., serialized data. The BBPD is connected to the buffer and the VCO for receiving the amplified receiver data and a VCO clock signal, respectively. The BBPD generates an early-late signal based on the amplified receiver data and the VCO clock signal. The VCO is connected to the BBPD, the up-down counter, and the frequency control circuit and receives the early-late signal and a frequency control code from the BBPD and the up-down counter, respectively. The VCO generates the VCO clock signal based on the early-late signal and the frequency control code. The frequency control circuit includes a counter and a digital comparator. The counter is connected to the VCO and the digital comparator, and receives the VCO clock signal from the VCO. The counter determines a frequency of the VCO clock signal, and generates a clock count value based on the VCO clock signal. The digital comparator receives the clock count value therefrom. The digital comparator is further connected to a reference clock generator, and receives a reference clock signal therefrom. The digital comparator generates an up-down signal based on the clock count value, the reference clock signal, and a target count value. The target count value is a ratio of a target frequency to a frequency of the reference clock signal. The up-down counter is connected to the digital comparator and receives the up-down signal therefrom. The up-down counter increments or decrements the frequency control code by a predefined value based on the up-down signal for matching the frequency of the VCO clock signal to the target frequency. The CDR circuit performs fast phase locking, prevents jitter in the receiver data, and staggering of the VCO clock signal, and consumes less power.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

Figure 1:
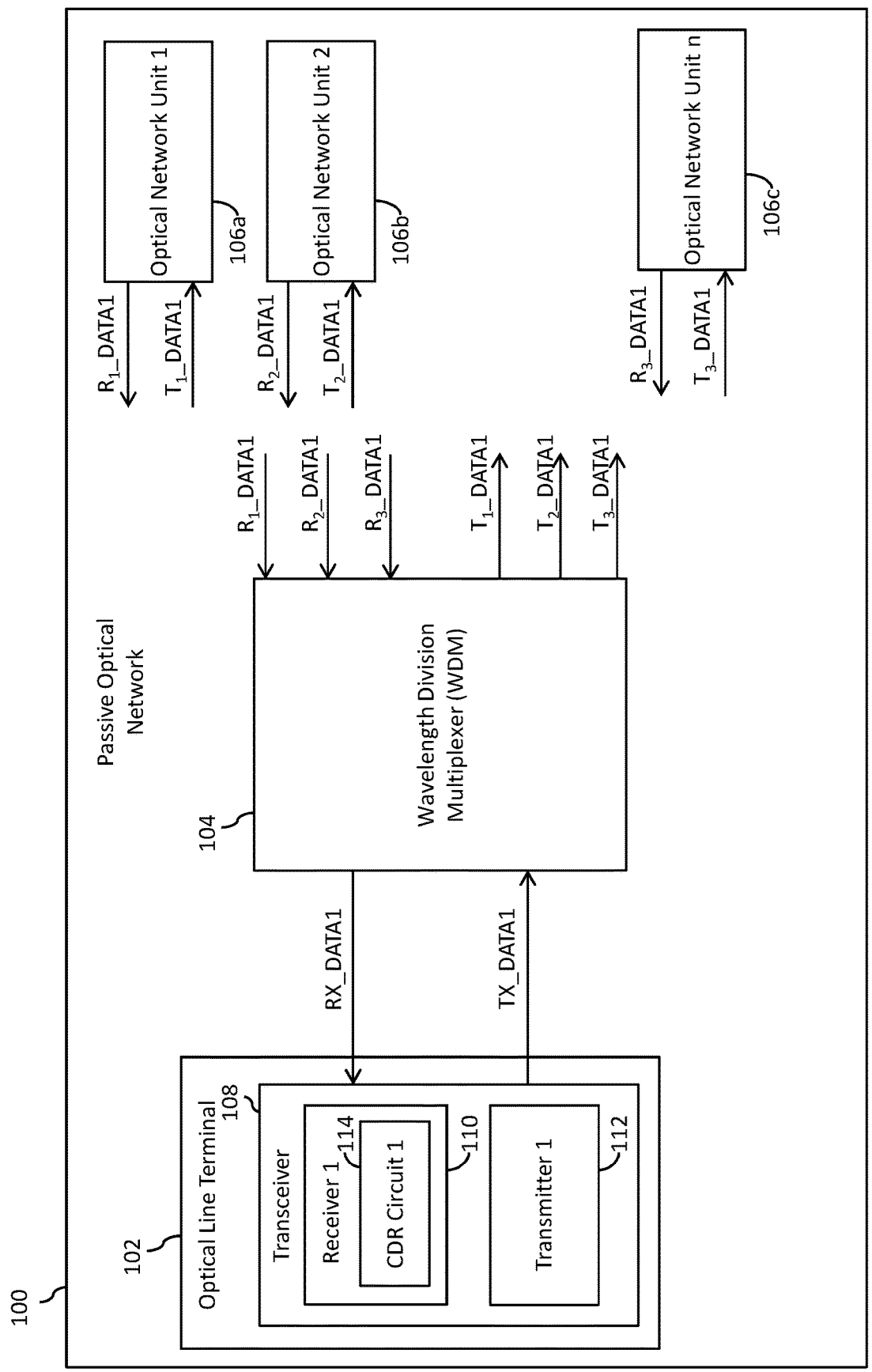
FIG. 1 is a schematic block diagram of a passive optical network (PON), in accordance with an embodiment of the present invention.

Referring now to FIG. 1, a schematic block diagram of a passive optical network (PON) 100 in accordance with an embodiment of the present invention is shown. The PON 100 includes an optical line terminal (OLT) 102, a wavelength division multiplexer (WDM) 104, and a plurality of optical network units (ONUs), out of which first through third ONUs 106a-106c are shown. The OLT 102 is typically located in a hub (not shown) of the OLT 102. The hub (not shown) is used by internet service providers for providing fiber optic internet connectivity to multiple end users. The OLT 102 includes a transceiver 108. The transceiver 108 includes a first receiver 110 and a first transmitter 112 for receiving and transmitting first receiver data RX_DATA1 and first transmission data TX_DATA1, respectively.

Downstream communication in the PON 100 involves transmission of first transmission data TX_DATA1 from the OLT 102 to the first through third ONUs 106a-106c. The transceiver 108 transmits the first transmission data TX_DATA1 to the WDM 104 in continuous mode. In continuous mode, the OLT 102 transmits the first transmission data TX_DATA1 to the WDM 104 as a constant stream of serialized data. The WDM 104 is an optical device in which power of the first transmission data TX_DATA1 or the first receiver data RX_DATA1 is split or combined, respectively. During downstream transmission, the WDM 104 splits the first transmission data TX_DATA1 into first through third transmission data streams T1_DATA1-T3_DATA1. Each of the first through third ONUs 106a-106c receives the first through third transmission data streams T1_DATA1-T3_DATA1, respectively. Each of the first through third ONUs 106a-106c then transmits the first through third transmission streams T1_DATA1-T3_DATA1 to their respective end users (not shown).

Upstream communication in the PON 100 involves transmission of first receiver data RX_DATA1 to the OLT 102. The first through third ONUs 106a-106c transmit first through third receiver data packets R1_DATA1-R3_DATA1 in burst mode. Burst mode is a temporary high-speed data transmission mode used to facilitate sequential data transfer at maximum throughput. The WDM 104 receives the first through third receiver data packets R1_DATA1-R3_DATA1. The WDM 104 further transmits one of the first through third receiver data packets R1_DATA1-R3_DATA1 to the OLT 102 as the first receiver data RX_DATA1. The OLT 102 employs a first clock and data recovery (CDR) circuit 114 in the transceiver 108 to generate a clock that can lock to the phase of the first receiver data RX_DATA1 in a less amount of time as compared to conventional CDR circuits, and to further avoid data loss. The first CDR circuit 114 of the transceiver 108 will be explained in conjunction with FIG. 2.

Figure 2:
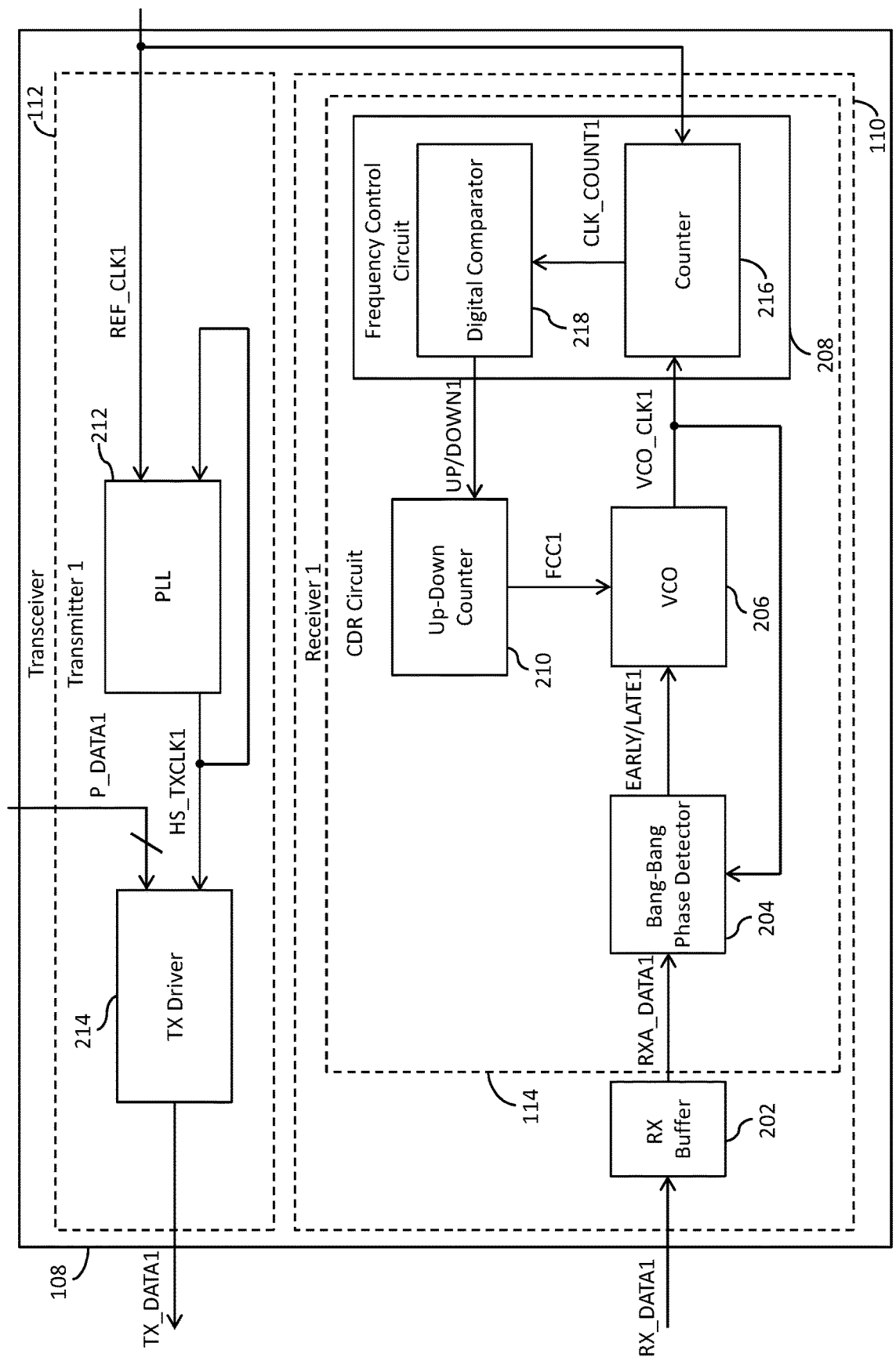
FIG. 2 is a schematic block diagram of a transceiver of an optical line terminal of the PON of FIG. 1, in accordance with an embodiment of the present invention.

Referring now to FIG. 2, a schematic block diagram of the transceiver 108 in accordance with an embodiment of the present invention is shown. The transceiver 108 includes the first receiver 110 and the first transmitter 112. The first receiver 110 includes a buffer 202 and the first CDR circuit 114. The first CDR circuit 114 includes a bang-bang phase detector (BBPD) 204, a voltage controlled oscillator (VCO) 206, a frequency control circuit 208, and an up-down counter 210.

The buffer 202 receives the first receiver data RX_DATA1 from the WDM 104 of FIG. 1. The buffer 202 performs signal conditioning processes such as amplification and equalization on the first receiver data RX_DATA1 and outputs first amplified receiver data RXA_DATA1 (also referred to as "first serialized data RXA_DATA1").

The BBPD 204 is connected to the buffer 202 for receiving the first amplified receiver data RXA_DATA1. In an embodiment, the BBPD 204 is an Alexander BBPD 204. The BBPD 204 further receives a first VCO clock signal VCO_CLK1. The BBPD 204 compares the first amplified receiver data RXA_DATA1 and the first VCO clock signal VCO_CLK1 for determining a phase difference therebetween, and generates a first early-late signal EARLY/LATE1 based on the comparison. In a scenario, the first amplified receiver data RXA_DATA1 makes a transition from a first logic state to a second logic state. Further, a rising edge of the first VCO clock signal VCO_CLK1 arrives at the BBPD 204 after the transition of the first amplified receiver data RXA_DATA1 from the first logic state to the second logic state. Thus, the BBPD 204 generates the first early-late signal EARLY/LATE1 at the first logic state since the first VCO clock signal VCO_CLK1 is late with respect to the first amplified receiver data RXA_DATA1. In another scenario, the rising edge of the first VCO clock signal VCO_CLK1 arrives before the transition of the first amplified receiver data RXA_DATA1. Hence, the BBPD 204 generates the first early-late signal EARLY/LATE1 at the second logic state since the first VCO clock signal VCO_CLK1 is early with respect to the first amplified receiver data RXA_DATA1.

The VCO 206 is connected to the BBPD 204 and the up-down counter 210 for receiving the first early-late signal EARLY/LATE1 and a first frequency control code FCC1, respectively. The VCO 206 generates the first VCO clock signal VCO_CLK1 based on the first early-late signal EARLY/LATE1 and the first frequency control code FCC1. The VCO 206 controls a frequency and a phase of the first VCO clock signal VCO_CLK1 based on the first frequency control code FCC1 and the first early-late signal EARLY/LATE1, respectively. The first VCO clock signal VCO_CLK1 is fed-back to the BBPD 204 for generating the first early-late signal EARLY/LATE1. When the first early-late signal EARLY/LATE1 is at the first logic state, the first early-late signal reduces the frequency of the first VCO clock signal VCO_CLK1. When the first early-late signal EARLY/LATE1 is at the second logic state, the first early-late signal increases the frequency of the first VCO clock signal VCO_CLK1. The increase in the clock frequency of the first VCO clock signal VCO_CLK1 results in advancing the phase thereof while the reduction in the clock frequency of the first VCO clock signal VCO_CLK1 results in delaying the phase thereof. As a result, the BBPD 204 changes the phase of the first VCO clock signal VCO_CLK1 based on the first early-late signal EARLY/LATE1. The first early-late signal EARLY/LATE1 thus acts as a proportional control for the first VCO clock signal VCO_CLK1.

The frequency control circuit 208 is connected to the VCO 206 for receiving the first VCO clock signal VCO_CLK1. The frequency control circuit 208 further receives a first reference clock signal REF_CLK1. An on-chip clock generator (not shown) of the OLT 102 generates the first reference clock signal REF_CLK1. The frequency control circuit 208 includes a counter 216 and a digital comparator 218.

The counter 216 is connected to the VCO 206 for receiving the first VCO clock signal VCO_CLK1, and further receives the first reference clock signal REF_CLK1. The counter 216 counts a number of clock cycles of the first VCO clock signal VCO_CLK1 over a predetermined number of cycles of the first reference clock signal REF_CLK1 for outputting a first clock count value CLK_COUNT1. Thus, the first clock count value CLK_COUNT1 is a ratio of a frequency of the first VCO clock signal VCO_CLK1 to a frequency of the first reference clock signal REF_CLK1. The digital comparator 218 is connected to the counter 216 for receiving the first clock count value CLK_COUNT1. The digital comparator 218 is further pre-calibrated with a first target count value TRGT_COUNT1. The first target count value TRGT_COUNT1 is equal to a ratio of a target frequency to a frequency of the first reference clock signal REF_CLK1. The target frequency is a frequency of the first receiver data RX_DATA1 when the buffer 202 receives the first receiver data RX_DATA1. The buffer 202 transmits the first amplified receiver data RXA_DATA1 to the BBPD 204. It will be apparent to a person skilled in the art that the first amplified receiver data RX_DATA1 is at the target frequency. The first VCO clock signal VCO_CLK1 is frequency synchronized to the receiver data RX_DATA1 when the frequency of the first VCO clock signal VCO_CLK1 is equal to the target frequency.

The digital comparator 218 compares the first clock count value CLK_COUNT1 and the first target count value TRGT_COUNT1, and generates a first up/down signal UP/DOWN1. When the first clock count value CLK_COUNT1 is greater than the first target count value TRGT_COUNT1, the frequency of the first VCO clock signal VCO_CLK1 is greater than the target frequency. The digital comparator 218 hence generates the first up/down signal UP/DOWN1 at the first logic state. Similarly, when the first clock count value CLK_COUNT1 is less than the first target count value TRGT_COUNT1, the frequency of the first VCO clock signal VCO_CLK1 is less than the target frequency. The digital comparator 218 hence generates the first up/down signal UP/DOWN1 at the second logic state.

In one example, the first VCO clock signal VCO_CLK1 has a frequency of 9.9 gigahertz (GHz) and the first reference clock signal REF_CLK1 has a frequency of 100 megahertz (MHz). The counter 216 generates the first clock count value CLK_COUNT1 as 9900000000/100000000=99. The target frequency of the first VCO clock signal VCO_CLK1 is 10 GHz. Hence, the first target count value is 10000000000/100000000=100. The digital comparator 218 compares the first clock count value CLK_COUNT1 of 99 to the first target count value TRGT_COUNT1 of 100. Since the first clock count value CLK_COUNT1 is greater than the first target count value TRGT_COUNT1 100, the digital comparator 218 generates the first up/down signal UP/DOWN1 at the first logic state, i.e., a high logic state.

The up-down counter 210 is asynchronous with respect to the counter 216. The up-down counter 210 is pre-calibrated with an initial value of the first frequency control code FCC1. The initial value of the first frequency control code FCC1 corresponds to the frequency of the first VCO clock signal VCO_CLK1 when the transceiver 108 starts transmitting the first transmission data TX_DATA1. The initial value of the first frequency control code FCC1 is input to the VCO 206 for controlling the frequency of the first VCO clock signal VCO_CLK1. The up-down counter 210 is connected to the digital comparator 218 for receiving the first up/down signal UP/DOWN1. The up-down counter 210 increases or decreases the first frequency control code FCC1 of the up-down counter 210 based on the first up-down signal UP/DOWN1. The frequency control circuit 208 maintains parts per million (ppm) accuracy of the frequency of the first VCO clock signal VCO_CLK1 by way of the first up/down signal UP/DOWN1. When the first up/down signal UP/DOWN1 is at the first logic state, the up-down counter 210 decrements the first frequency control code FCC1 by a predefined value over multiple clock cycles of the first VCO clock signal VCO_CLK1 to match the frequency of the first VCO clock signal VCO_CLK1 to the target frequency. The predefined value is pre-calibrated in the up-down counter 210. When the first up/down signal UP/DOWN1 is at the second logic state, the up-down counter 210 increments the first frequency control code FCC1 by the predefined value over multiple clock cycles of the first VCO clock signal VCO_CLK1 to match the frequency of the first VCO clock signal VCO_CLK1 to the target frequency.

The first transmitter 112 includes a phase locked loop (PLL) 212 and a transmission driver 214. The PLL 212 is connected to the on-chip clock generator (not shown) for receiving the first reference clock signal REF_CLK1. The PLL 212 generates a first high frequency transmission clock signal HS_TXCLK1. The first high frequency transmission clock signal HS_TXCLK1 is fed back into the PLL 212 for varying a phase of the first high frequency transmission clock signal HS_TXCLK1. The transmission driver 214 is connected to the PLL 212 for receiving the first high frequency transmission clock signal HS_TXCLK1. The transmission driver 214 further receives first parallel data P_DATA1 from a first system on chip (SoC) (not shown) of the OLT 102. The transmission driver 214 includes a plurality of drivers such as data serialization driver, signal amplification driver, and the like. The transmission driver 214 performs data serialization on the first parallel data P_DATA1 for generating the first transmission data TX_DATA1 that is phase and frequency synchronized to the first high frequency transmission clock signal HS_TXCLK1.

The frequency control circuit 208 controls the frequency of the first VCO clock signal VCO_CLK1 thereby maintaining a low ppm accuracy of the first VCO clock signal VCO_CLK1. Employing the frequency control circuit 208 eliminates the need for an integral control circuit for the VCO 206, thereby reducing the locking time of the first VCO clock signal VCO_CLK1, and further preventing jitter in the first receiver data RX_DATA1. Further, elimination of the integral control for the VCO 206 facilitates the transceiver 108 to sample the data at high clock speeds, and further prevents staggering of the first VCO clock signal VCO_CLK1. Sampling the data at high clock speeds allows for the OLT 102 to receive and transmit the first receiver data RX_DATA1 and the first transmission data TX_DATA1, respectively, at high speeds. Further, the OLT 102 consumes less power due to the simple design of the first CDR circuit 114.

Figure 3:
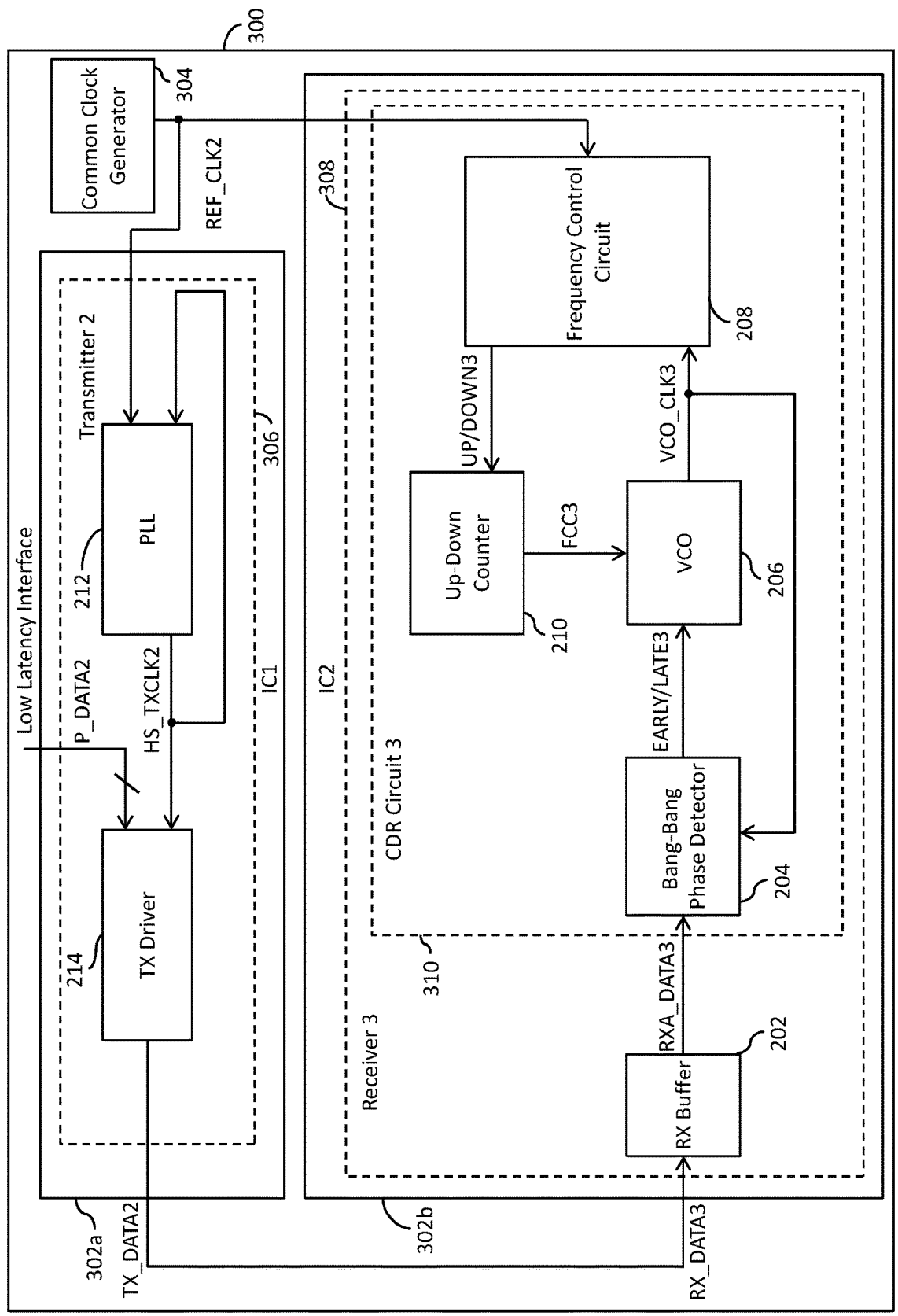
FIG. 3 is a schematic block diagram of a low latency interface (LLI) system, in accordance with another embodiment of the present invention.

Referring now to FIG. 3, a schematic block diagram of a low latency interface (LLI) system 300, in accordance with another embodiment of the present invention is shown. The LLI system 300 provides a point to point interface between a central processor (not shown) and a baseband processor (not shown). Typically, the baseband processor does not include a random access memory (RAM), and uses a RAM of the central processor through direct memory access (DMA). Motherboards of central processing units (CPUs) employ the LLI system 300. Many chips on the motherboard such as graphics cards, disk drive controllers, network cards, sound cards, and the like employ DMA for transferring data from one chip to another. In DMA, data transfer happens in burst mode. Further, in the LLI system 300, data transfer occurs between chips that are physically located near to each other. This allows for a common clock that provides a reference clock to all the chips that transfer data.

The LLI system 300 includes a first integrated circuit (IC) 302a, a second IC 302b, and a common clock generator 304. The first IC 302a includes a second transmitter 306. The second transmitter 306 preferably has the same design as the first transmitter 112 of FIG. 2. Thus, it will be apparent to a person skilled in the art that the second transmitter 306 has a similar function as that of the first transmitter 112. The second transmitter 306 receives a second reference clock signal REF_CLK2. The common clock generator 304 generates the second reference clock signal REF_CLK2. The second transmitter 306 further receives second parallel data P_DATA2 from a second SoC (not shown) of the first IC 302a. The second transmitter 306 generates the second transmission data TX_DATA2 based on the second parallel data P_DATA2. The first IC 302a further includes a second receiver (not shown) that receives the second reference clock signal REF_CLK2. The second receiver (not shown) further includes a second CDR circuit (not shown). The second receiver (not shown) and the second CDR circuit (not shown) are structurally and functionally similar to the first receiver 110 and the first CDR circuit 114 of FIG. 2, respectively. Thus, it will be apparent to a person skilled in the art that the second receiver (not shown) generates a second VCO clock signal (not shown).

The second IC 302b includes a third receiver 308. The third receiver 308 further includes a third CDR circuit 310. The third receiver 308 is structurally similar to the first receiver 110 of FIG. 2. Thus, it will be apparent to a person skilled in the art that the third receiver 308 has a similar function as that of the first receiver 110. The second IC 302b further includes a third transmitter (not shown). The third transmitter (not shown) is structurally and functionally similar to the first transmitter 112. The third receiver 308 is connected to the second transmitter 306 for receiving the second transmission data TX_DATA2 as third receiver data RX_DATA3. The third receiver 308 is further connected to the common clock generator 304 for receiving the second reference clock signal REF_CLK2. Thus, the third receiver 308 generates a third VCO clock signal VCO_CLK3. The second reference clock signal REF_CLK2 is common to both the first and second ICs 302a and 302b. The second VCO clock signal (not shown) and the third VCO clock signal VCO_CLK3 of the first and second ICs 302a and 302b are hence in frequency synchronization with the second and third receiver data RX_DATA2 and RX_DATA3, respectively.

The fast locking time of the third VCO clock signal VCO_CLK3 prevents errors in the third receiver data RX_DATA3, and further leads to a faster transmission ability of the second transmitter 306. Further, the second IC 302b consumes less power due to the simple design of the third CDR circuit 310. Similarly, the first IC 302a consumes less power.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

The terms first and second logic states have been used herein to distinguish before high and low signals. For example, the first logic state could signify a signal that is 0 v while a second logic state would then indicate a signal that has a logical '1' value, with the actual voltage value for logic 1 depending on circuit technology. The circuits described herein also can be designed using either positive or negative logic, so an active signal in one embodiment could be a logic '0' and an inactive signal would then have a logic value of '1'.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A clock and data recovery (CDR) circuit, comprising:
   a phase detector that receives serialized data and a voltage controlled oscillator (VCO) clock signal, determines that the VCO clock signal is at least one of early and late with respect to the serialized data, and generates an early-late signal that is received by a VCO;
   the VCO that receives the early-late signal from the phase detector and a frequency control code from a first counter, and generates the VCO clock signal that is received by the phase detector and a frequency control circuit, wherein the VCO controls a phase of the VCO clock signal based on the early-late signal, and wherein the VCO controls a frequency of the VCO clock signal based on the frequency control code;
   the frequency control circuit that receives the VCO clock signal and a reference clock signal, and generates an up/down signal that is received by the first counter; and
   the first counter that receives the up/down signal and outputs the frequency control code that is received by the VCO, wherein the first counter performs at least one of incrementing and decrementing the frequency control code by a predefined value based on the up/down signal for matching the frequency of the VCO clock signal to a target frequency.

2. The CDR circuit of claim 1, wherein the CDR circuit is connected to a buffer for receiving the serialized data, and wherein the buffer receives and amplifies receiver data to generate the serialized data.

3. The CDR circuit of claim 1, wherein the frequency control circuit comprises:
   a second counter that receives the VCO clock signal, counts a number of clock cycles of the VCO clock signal over a predetermined time period, and generates a clock count value, wherein the clock count value is a ratio of the frequency of the VCO clock signal to a frequency of the reference clock signal; and
   a digital comparator that receives the clock count value and the reference clock signal, compares the clock count value with a target count value, and generates the up/down signal, wherein the target count value is a ratio of the target frequency to the frequency of the reference clock signal.

4. The CDR circuit of claim 3, wherein the digital comparator is pre-calibrated with the target count value.

5. The CDR circuit of claim 3, wherein the first counter increments the frequency control code by the predefined value when the clock count value is less than the target count value for matching the frequency of the VCO clock signal to the target frequency.

6. The CDR circuit of claim 3, wherein the first counter decrements the frequency control code by the predefined value when the clock count value is greater than the target count value for matching the frequency of the VCO clock signal to the target frequency.

7. The CDR circuit of claim 1, wherein the first counter is an up-down counter.

8. The CDR circuit of claim 1, wherein the target frequency is a frequency of the serialized data.

9. A clock and data recovery (CDR) circuit, comprising:
a phase detector that receives serialized data and a voltage controlled oscillator (VCO) clock signal, determines that the VCO clock signal is at least one of early and late with respect to the serialized data, and generates an early-late signal;
a VCO that receives the early-late signal and a frequency control code, and generates the VCO clock signal, wherein the VCO controls a phase of the VCO clock signal based on the early-late signal, and wherein the VCO controls a frequency of the VCO clock signal based on the frequency control code;
a frequency control circuit comprising:
a first counter that receives the VCO clock signal, counts a number of clock cycles of the VCO clock signal over a predetermined time period, and generates a clock count value; and
a digital comparator that receives the clock count value and a reference clock signal, compares the clock count value with a target count value, and generates an up/down signal; and
a second counter that receives an up/down signal and outputs the frequency control code, wherein the first counter performs at least one of incrementing and decrementing the frequency control code by a predefined value based on the up/down signal for matching the frequency of the VCO clock signal to a target frequency.

10. The CDR circuit of claim 9, wherein the CDR circuit is connected to a buffer for receiving the serialized data, and wherein the buffer receives and amplifies receiver data to generate the serialized data.

11. The CDR circuit of claim 9, wherein the second counter increments the frequency control code by the predefined value when the clock count value is less than the target count value for matching the frequency of the VCO clock signal to the target frequency.

12. The CDR circuit of claim 9, wherein the second counter decrements the frequency control code by the predefined value when the clock count value is greater than the target count value for matching the frequency of the VCO clock signal to the target frequency.

13. The CDR circuit of claim 9, wherein the clock count value is a ratio of the frequency of the VCO clock signal to a frequency of the reference clock signal.

14. The CDR circuit of claim 9, wherein the target count value is a ratio of the target frequency to a frequency of the reference clock signal.

15. The CDR circuit of claim 9, wherein the target frequency is a frequency of the serialized data.

16. A low latency interface system comprising:
a first integrated circuit of the plurality of integrated circuits including a transmitter configured to receive a parallel data signal and a reference clock signal, generate transmission data based on the parallel data signal, and transmit the transmission data; and
a second integrated circuit of the plurality of integrated circuits including a receiver configured to receive the transmission data from the first integrated circuit and the reference cock signal, the receiver comprising a clock and data recovery circuit comprising:
a phase detector that receives serialized data based on the received transmission data and a voltage controlled oscillator (VCO) clock signal, determines that the VCO clock signal is at least one of early and late with respect to the serialized data, and generates an early-late signal;
a VCO that receives the early-late signal and a frequency control code, and generates the VCO clock signal, wherein the VCO controls a phase of the VCO clock signal based on the early-late signal, and wherein the VCO controls a frequency of the VCO clock signal based on the frequency control code;
a frequency control circuit comprising:
a first counter that receives the VCO clock signal, counts a number of clock cycles of the VCO clock signal over a predetermined time period, and generates a clock count value, wherein the clock count value is a ratio of the frequency of the VCO clock signal to a frequency of the reference clock signal; and
a digital comparator that receives the clock count value and the reference clock signal, compares the clock count value with a target count value, and generates the up/down signal, wherein the target count value is a ratio of the target frequency to the frequency of the reference clock signal; and
a second counter that receives the up/down signal and outputs the frequency control code, wherein the first counter performs at least one of incrementing and decrementing the frequency control code by a predefined value based on the up/down signal for matching the frequency of the VCO clock signal to a target frequency.

17. The low latency interface system of claim 16, wherein the plurality of integrated circuits are physically located near each other.

18. The low latency interface system of claim 16, wherein the plurality of integrated circuits are on a same motherboard.

19. The low latency interface system of claim 16, further comprising a clock generator configured to generate the reference clock signal and transmit the reference clock signal to each of the plurality of integrated circuits.

20. The low latency interface system of claim 16, wherein the parallel data signal is received by the transmitter from a system on chip of the first integrated circuit.

* * * * *

UNITED STATES PATENT AND TRADEMARK OFFICE
CERTIFICATE OF CORRECTION

PATENT NO. : 10,608,645 B2
APPLICATION NO. : 15/862857
DATED : March 31, 2020
INVENTOR(S) : Biman Chattopadhyay et al.

It is certified that error appears in the above-identified patent and that said Letters Patent is hereby corrected as shown below:

In the Claims

Column 12, Claim 16, Line 7, delete "the reference cock" and insert --the reference clock--.

Signed and Sealed this
Twelfth Day of January, 2021

Andrei Iancu
*Director of the United States Patent and Trademark Office*